US005952136A

United States Patent [19]

Daems et al.

[11] Patent Number: 5,952,136

[45] Date of Patent: Sep. 14, 1999

[54] METHOD FOR THE PREPARATION OF AN IMPROVED HEAT MODE IMAGE

[75] Inventors: Eddie Daems, Herentals; Joan Vermeersch, Deinze; Luc Leenders, Herentals; Rita Torfs, Herenhout, all of Belgium

[73] Assignee: AGFA-Gevaert, N.V., Mortsel, Belgium

[21] Appl. No.: 08/979,492

[22] Filed: Nov. 28, 1997

[30] Foreign Application Priority Data

Dec. 6, 1996 [EP] European Pat. Off. .............. 96203432

[51] Int. Cl.[6] ........................................................ G03F 9/00

[52] U.S. Cl. ............................ 430/22; 430/200; 430/350; 430/512; 430/964; 430/944; 430/945

[58] Field of Search ..................................... 430/512, 348, 430/3, 350, 200, 203, 964, 22, 945, 944

[56] References Cited

U.S. PATENT DOCUMENTS

| | | | |
|---|---|---|---|
| 4,943,519 | 7/1990 | Helling et al. | 430/512 |
| 5,506,085 | 4/1996 | Van Damme et al. | 430/200 |

*Primary Examiner*—Thorl Chea
*Attorney, Agent, or Firm*—Breiner & Breiner

[57] ABSTRACT

A method is disclosed, and a corresponding thermal imaging medium for use with it, for the formation of an improved heat mode image comprising (A) exposing information-wise to laser radiation a thermal imaging medium comprising (1) a transparent support, (2) an image recording layer containing a hydrophilic binder, a substance capable of converting laser radiation into heat, and a dispersion of a hydrophobic polymer capable of undergoing thermocoagulation by the action of heat and having a built-in UV-absorber. A heat mode image with high density and improved resistance to physical damage is obtained.

9 Claims, No Drawings

METHOD FOR THE PREPARATION OF AN IMPROVED HEAT MODE IMAGE

DESCRIPTION

1. Field of the Invention

The present invention deals with a method for the formation of an improved heat mode image and a corresponding thermal imaging medium for use with that method.

2. Background of the Invention

Conventional photographic materials based on silver halide are used for a large variety of applications. For instance, in the pre-press sector of graphic arts rather sensitive camera materials are used for obtaining screened images. Scan films are used for producing colour separations from multicolour originals. Phototype setting materials record the information fed to phototype- and image setters. Relative insensitive photographic materials serve as duplicating materials usually in a contact exposure process. Other fields include materials for medical recording, duplicating and hard copy, X-ray materials for non-destructive testing, black-and-white and colour materials for amateur- and professional still photography and materials for cinematographic recording and printing.

Silver halide materials have the advantage of high potential intrinsic sensitivity and excellent image quality. On the other hand they show the drawback of requiring several wet processing steps employing chemical ingredients which are suspect from an ecological point of view.

In the past several proposals have been made for obtaining an imaging element that can be developed using only dry development steps without the need of processing liquids as it is the case with silver halide photographic materials.

A dry imaging system known since quite a while is 3M's dry silver technology. It is a catalytic process which couples the light-capturing capability of silver halide to the image-forming capability of organic silver salts.

Another type of non-conventional materials as alternative for silver halide is based on photopolymerisation. The use of photopolymerizable compositions for the production of images by information-wise exposure thereof to actinic radiation is known since quite a while. All these methods are based on the principle of introducing a differentiation in properties between the exposed and non-exposed parts of the photopolymerizable composition e.g. a difference in adhesion, conductivity, refractive index, tackiness, permeability, diffusibility of incorporated substances e.g. dyes etc. The thus produced differences may be subsequently employed in a dry treatment step to produce a visible image and/or master for printing e.g. a lithographic or electrostatic printing master.

As a further alternative for silver halide chemistry dry imaging elements are known that can be image-wise exposed using an image-wise distribution of heat. When this heat pattern is applied directly by means of a thermal head such elements are called thermographic materials. When the heat pattern is applied by the transformation of intense laser light into heat these elements are called heat mode materials or thermal imaging media. They offer the additional advantage compared to most photo mode systems that they do not need to be handled in a dark room nor that any other protection from ambient light is needed.

In a particular type of heat mode recording materials information is recorded by creating differences in optical reflection and/or in optical transmission on the recording layer. The recording layer has high optical density and absorbs radiation beams which impinge thereon. The conversion of radiation into heat brings about a local temperature rise, causing a thermal change such as evaporation or ablation to take place in the recording layer. As a result, the irradiated parts of the recording layer are totally or partially removed, and a difference in optical density is formed between the irradiated parts and the unirradiated parts (cf. U.S. Pat. Nos. 4,216,501, 4,233,626, 4,188,214 and 4,291,119 and British Pat. No. 2,026,346). The recording layer of such heat mode recording materials is usually made of metals, dyes, or polymers.

In other heat mode image forming systems based on ablation the recorded image is transferred to an acceptor sheet. As a consequence such an acceptor must be applied by lamination before the recording step, as disclosed e.g. in U.S. Pat. No. 4,245,003.

In still another type of thermographic and heat mode elements, e.g. as disclosed in EP 0 674 217, density is generated by image-wise chemical reduction of organic metal salts, preferably silver salts such as silver behenate, without the presence of catalytic amounts of exposed silver halide such it is the case in the dry silver system.

Another important category of heat mode recording materials is based on change of adhesion, e.g. as disclosed in U.S. Pat. Nos. 4,123,309, 4,123,578, 4,157,412, 4,547,456 and PCT publ. Nos. WO 88/04237, WO 93/03928, and WO 95/00342. In a preferred embodiment such a thermal imaging medium comprises a transparent support and an imaging layer containing carbon black, optionally additional layers and a stripping sheet. By the conversion of intense laser light into heat on information-wise exposure a surface part of the support liquefies and firmly locks the carbon black, so that after delamination a negative carbon black image is formed on the support. In a further elaboration of this system, disclosed in WO 92/09442, the image forming layer contains discrete thermoplastic particles, e.g. poly(methylmethacrylate) applied from an aqueous latex.

A still older type of thermal recording medium is based on differentiation in the hydrophobicity and as a consequence the water-permeability of the recording layer upon image-wise exposure. So, in GB 1160221 a method for information recording is disclosed wherein a recording material is used comprising a water-permeable recording layer which incorporates hydrophobic thermoplastic particles, e.g. polyethylene, that can be rendered substantially less water-permeable by the action of heat generated by the conversion of intense electromagnetic radiation, preferably again by carbon black. In a further variant of this system, described in GB 1208414, the hydrophobic material is non-polymeric, preferably a wax. The systems are preferably used for the reproduction of a graphic line or halftone original.

A similar system can be used for making a lithographic printing plate. So, in European Patent application, appl. No. 95202873 there is provided a method for making a lithographic printing plate comprising the steps of (1) image-wise exposing to light an imaging element comprising (i) on a hydrophilic surface of a lithographic base an image forming layer comprising hydrophobic thermoplastic polymer particles dispersed in a hydrophilic binder and (ii) a compound capable of converting light to heat, said compound being comprised in said image forming layer or a layer adjacent thereto;

(2) and developing a thus obtained image-wise exposed imaging element by rinsing it with plain water or an aqueous liquid.

A problem with heat mode systems based on the use of carbon or alike as image forming substance and at the same time as laser to heat converting substance lies in the fact that it is difficult to obtain a sufficiently high density after processing. However, for image setting purposes a density of at least 3.0 is indispensable. When trying to remediate this drawback by coating the recording layer containing the carbon black or alike at a higher coverages the upper part or the under part of the recording layer, depending on the side through which the element is laser exposed, becomes more and more vulnerable to physical damage. This is especially true for those systems where a wash-off development step is applied resulting in partial removal of the image forming layer also in the exposed parts where this removal should not occur at all resulting again in too a low final density. As a second drawback it should be mentioned that thermal media using a high carbon coverage suffer from frayed line edges in the final image.

The present invention extends the teachings on the formation of a heat mode image comprising a wash-off development step.

It is an object of the present invention to provide a method for the formation of a heat mode image, and a corresponding thermal imaging medium for use with it, that generates images with high density which are less susceptible to physical damage.

It is a further object of the present invention to provide a method for the formation of a heat mode image that exhibits good sharpness characteristics.

3. Summary of the Invention

The objects of the present invention are realized by providing a method for the formation of a heat mode image, and a corresponding thermal imaging medium for use with it, comprising the following steps:

(A) exposing information-wise to laser radiation a thermal imaging medium comprising (1) a transparent support, (2) an image recording layer containing a hydrophilic binder, a substance capable of converting laser radiation into heat, and a dispersion of a hydrophobic polymer capable of undergoing thermocoagulation by the action of heat and having a built-in UV-absorber, (B) removing the unexposed parts by a wash-off step thus leaving an image in the exposed parts.

4. Detailed Description

A transparent organic resin support can be chosen from, e.g., cellulose nitrate film, cellulose acetate film, polyvinyl acetal film, polystyrene film, polyethylene terephthalate film, polycarbonate film, polyvinylchloride film or poly-α-olefin films such as polyethylene or polypropylene film. The thickness of such organic resin film is preferably comprised between 0.05 and 0.35 mm. These organic resin supports are preferably coated with a subbing layer. The most preferred transparent support is a polyethylene terephthalate support. An example of a suitable subbing layer is a layer containing a polymer containing covalently bound chlorine. Suitable chlorine containing polymers are e.g. polyvinyl chloride, polyvinylidene chloride, a copolymer of vinylidene chloride, an acrylic ester and itaconic acid, a copolymer of vinyl chloride and vinylidene chloride, a copolymer of vinyl chloride, vinylidene chloride and itaconic acid, a copolymer of vinyl chloride, vinyl acetate and vinyl alcohol, A preferred chlorine containing polymer is co(vinylidenechloride-methylacrylate-itaconic acid; 88%/10%/2%). A most suitable subbing layer contains the latter polymer and a colloidal silica such as KIESELSOL 100F (Bayer AG).

Suitable hydrophilic binders for use in the image recording layer in connection with this invention are for example synthetic homo- or copolymers such as a polyvinylalcohol, a poly(meth)acrylic acid, a poly(meth)acrylamide, a polyhydroxyethyl(meth)acrylate, a polyvinylmethylether or natural binders such as gelatin, a polysacharide such as e.g. dextran, pullulan, cellulose, arabic gum, alginic acid. The most preferred binder is polyvinylalcohol.

Hydrophobic thermoplastic polymer particles having an incorporated UV-absorber in their polymeric chain preferably have a coagulation temperature above 35° C. and more preferably above 50° C. Coagulation may result from softening or melting of the thermoplastic polymer particles under the influence of heat. There is no specific upper limit to the coagulation temperature of the thermoplastic hydrophobic polymer particles, however the temperature should be sufficiently below the decomposition of the polymer particles. Preferably the coagulation temperature is at least 10° C. below the temperature at which the decomposition of the polymer particles occurs. When said polymer particles are subjected to a temperature above coagulation temperature they coagulate to form a hydrophobic agglomerate in the hydrophilic layer so that at these parts the hydrophilic layer becomes insoluble in plain water or an aqueous liquid.

Specific examples of hydrophobic polymer particles for use in connection with the present invention, in which UV absorbers can be built-in, are e.g. polyethylene, polyvinyl chloride, polymethyl (meth)acrylate, polyethyl (meth) acrylate, polyvinylidene chloride, polyacrylonitrile, polyvinyl carbazole, polystyrene, etc. or copolymers thereof. Most preferably used is polymethylmethacrylate.

The weight average molecular weight of the polymers may range from 5,000 to 1,000,000.

The hydrophobic particles may have a particle size from 0.01 $\mu$m to 50 $\mu$m, more preferably between 0.05 mm and 10 mm and most preferably between 0.05 $\mu$m and 2 $\mu$m.

The UV absorbers for building-in in the hydrophobic polymer can be chosen from the references known in the art provided they are chemically suited for incorporation in a polymer. These references describe e.g. the cyanomethyl sulfone-derived merocyanines of U.S. Pat. No. 3,723,154, the thiazolidones, benzotriazoles and thiazolothiazoles of U.S. Pat. Nos. 2,739,888, 3,253,921, 3,250,617 and 2,739,971, the triazoles of U.S. Pat. No. 3,004,896, and the hemioxonols of U.S. Pat. No. 3,125,597.

Actual useful UV absorbers for building-in in a polymer include following compounds:

UV-1

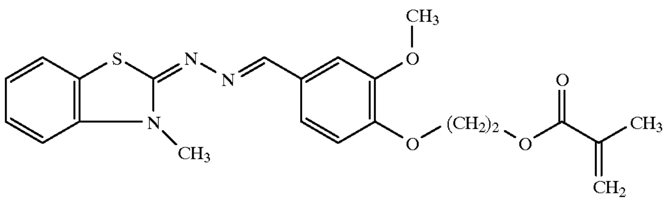

UV-2

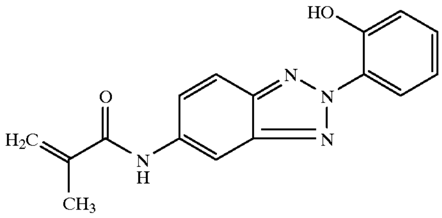

UV-3

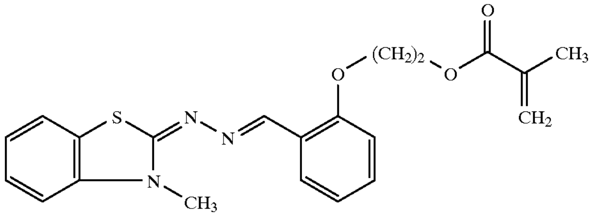

UV-4

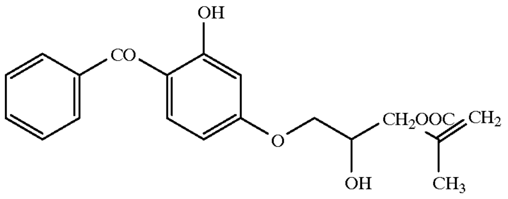

The polymer particles having a built-in UV absorber are present as a dispersion in the aqueous coating liquid of the image forming layer and may be prepared by the methods disclosed in U.S. Pat. No. 3,476,937. Another method especially suitable for preparing an aqueous dispersion of the thermoplastic polymer particles comprises:

dissolving the hydrophobic thermoplastic polymer in an organic water immiscible solvent, dispersing the thus obtained solution in water or in an aqueous medium and removing the organic solvent by evaporation.

The amount of hydrophobic thermoplastic polymer particles contained in the image forming layer is preferably between 20% by weight and 80% by weight, most preferably between 35% and 70%.

An important ingredient of the image forming layer is the radiation to heat converting substance that transforms the information-wise modulated laser radiation into an information-wise modulated pattern of heat. In a most preferred embodiment the laser is an infra-red laser like a diode laser or a NdYAG laser or a NdYLF laser, and the radiation to heat converting substance is an infra-red absorbing compound. This infra-red absorbing compound can be an infra-red dye or, more preferably as will be explained hereinafter, an infra-red absorbing pigment.

When using an infra-red dye the choice can be made from several chemical classes, e.g. indoaniline dyes, oxonol dyes, porphine derivatives, anthraquinone dyes, merostyryl dyes, pyrylium compounds and sqarylium derivatives. Suitable infra-red dye are described in numerous disclosures and patent applications in the field, e.g., from U.S. Pat. Nos. 4,886,733, 5,075,205, 5,077,186, 5,153,112, 5,244,771, from Japanese unexamined patent publications (Kokai) Nos. 01-253734, 01-253735, 01-253736, 01-293343, 01-234844, 02-3037, 02-4244, 02-127638, 01-227148, 02-165133, 02-110451, 02-234157, 02-223944, 02-108040, 02-259753, 02-187751, 02-68544, 02-167538, 02-201351, 02-201352, 03-23441, 03-10240, 03-10239, 03-13937, 03-96942, 03-217837, 03-135553, 03-235940, and from the European published patent application Nos. 0 483 740, 0 502 508, 0 523 465, 0 539 786, 0 539 978 and 0 568 022. This list is far from exhaustive and limited to rather recent disclosures.

Some actual useful infra-red dyes are listed below

ID-1 is a commercial product known as CYASORB IR165, marketed by American Cyanamid Co, Glendale Protective Technologie Division, Woodbury, N.Y. It is a mixture of two parts of the molecular non-ionic form (ID-1a) and three parts of the ionic form (ID-1b) (see below). The compounds are also available from Bayer AG.

ID-1a
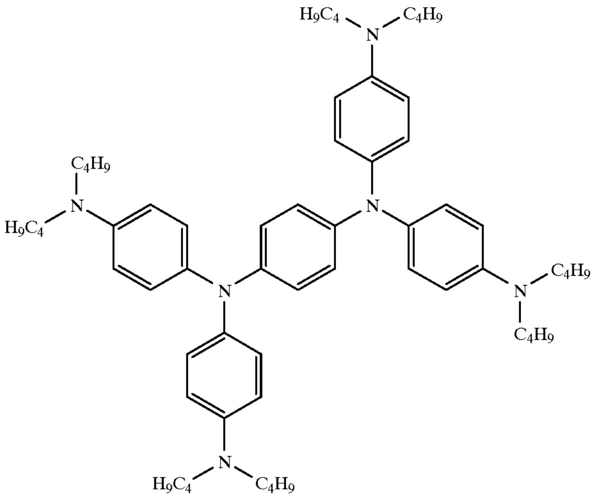
ID-1b
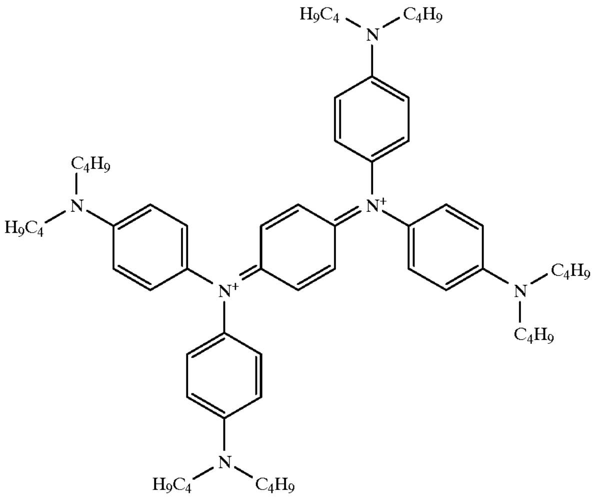
ID-2
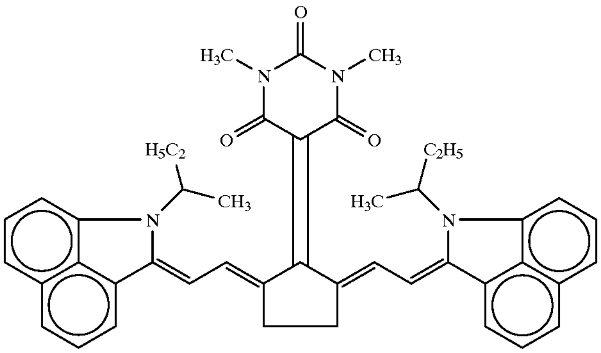

-continued

ID-3

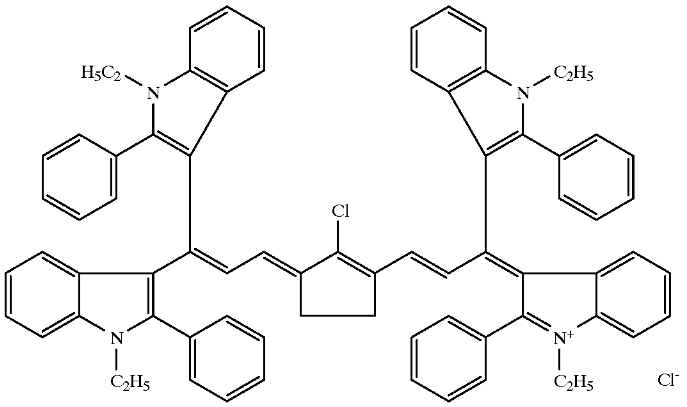

ID-4

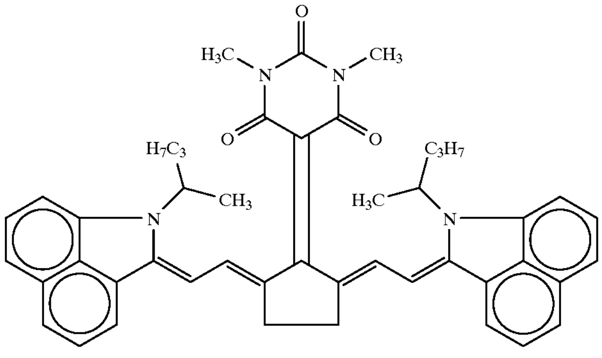

However, the substance converting laser radiation into heat is preferably an infra-red absorbing pigment instead of an infra-red absorbing dye, as will be explained hereinafter. Suitable pigments are e.g. a magnetic pigment, e.g. iron oxides, a coloured piment, e.g. copper phtalocyanine, or metal particles. However, the most preferred pigment is carbon black. It can be used in the amorphous or in the graphite form. The preferred average particle size of the carbon black ranges from 0.01 to 1 μm. Different commercial types of carbon black can be used, preferably with a very fine average particle size, e.g. RAVEN 5000 ULTRA II (Columbian Carbon Co.), CORAX L6, FARBRUSS FW 2000, SPEZIALSCHWARZ 5, SPEZIALSCWARZ 4A, SPEZIALSCHWARZ 250 and PRINTEX U (all from Degussa Co.).

The advantage of using a pigment like carbon black which also absorbs in the UV region subsists in the fact that the compound transforming intense laser radiation into heat is also an image forming substance. This would not be the case when using an infra-red dye with a low side absorption in the UV region. On the other hand however, as explained in the introduction section, use of carbon black as the sole image forming substance leads to problems with the obtainable density and with physical vulnerability. It is a particular useful feature of the preferred embodiment of the present invention that the image forming substance is composed of a mixture of a pigment like carbon black and a polymer having an incorporated UV absorber. The optimal ratio of the amounts of the two compounds will of course depend on the UV absorbing properties of the chosen pigment and polymer. In the preferred embodiment the carbon black cove rage is established in a way that it contributes to an optical UV density of at most 2.5 of the total image density. The rest of the image density is built up by the coagulated UV absorbing polymer.

Other optional ingredients of the image recording layer include surfactants and coating aids.

The thermal imaging medium is exposed information-wise by means of an intense laser beam. Such a laser can be an Ar ion laser, a HeNe laser, a Kr laser, a frequency doubled ND-YAG laser, a dye laser emitting in the visual spectral region. However in the preferred embodiment where the radiation to heat converting compound is an infra-red absorbing compound the laser is an infra-red laser. Especially preferred lasers are semiconductor diode lasers or solid state lasers such as a Nd-YAG laser emitting at 1064 nm, or a Nd-YLF laser emitting at 1053 nm. Other diode lasers emit at 823 nm or at 985 nm. A series of lasers can be used arranged in a particular array. Important parameters of the laser recording are the spot diameter (D) measured at the $1/e^2$ value of the intensity, the applied laser power on the film (P), and the recording speed of the laser beam (v).

The exposure step can be performed through the coated side or through the backside of the thermal recording medium.

After the exposure step and the accompanying thermo-coagulation of the UV absorber containing hydrophobe polymer the non-exposed non-image areas are removed by a wash-off step. This wash-off step can be performed by rinsing the exposed element under tap water, or by gently rubbing off with a humid pad, e.g. a cotton pad.

The obtained heat mode image can be used as an intermediate for the UV-exposure of a UV-sensitive element, e.g., a printing plate or a silver halide contact material. In both cases the heat mode image forms an alternative for a conventional developed silver halide image-setting film.

The following examples illustrate the present invention without however limiting it thereto.

EXAMPLES preparation comparative samples

In the thermal imaging media according to this example no polymer with built-in UV absorber is present.

Onto a 100 μm thick subbed polyethylene terephthalate support, provided with a 0.5 μm thick subbing layer comprising copoly(vinylidenechloride-methylacrylate-itaconic acid; 88/10/2%) the following coating solution was applied by means of a 40 μm coating knife:

| | comp. 1 | comp. 2 |
|---|---|---|
| poly(methylmethacrylate) latex (20%) | 4 g | 5 g |
| dispersion of 15% carbon black/0.36% UVON* | 2.2 g | 4.5 g |
| polyvinylalcohol 5% | 6.1 g | 7.7 g |
| water | 7.7 g | 3.8 g |

*commercial surfactant ULTRAVON from Ciba.

After drying an imaging layer with following composition was obtained:

| | comp. 1 | comp. 2 |
|---|---|---|
| poly(methylmethacrylate) | 1.6 $g/m^2$ | 2.0 $g/m^2$ |
| carbon black | 0.66 $g/m^2$ | 1.35 $g/m^2$ |
| polyvinylalcohol | 0.61 $g/m^2$ | 0.77 $g/m^2$ |
| total dry coverage | 2.9 $g/m^2$ | 4.2 $g/m^2$ |

preparation of invention sample

Onto an identical subbed support as in the comparative example a coating solution was applied with a 40 μm knife containing:

| | |
|---|---|
| poly(methylmethacrylate) with built in UV-1 | 4 g |
| dispersion of 15% carbon black and 6% UVON | 2.2 g |
| polyvinylalcohol 5% | 6.1 g |
| water | 7.7 g |

After drying an imaging layer with following composition was obtained:

| | |
|---|---|
| poly(methylmethacrylate)/UV-1 | 1.6 $g/m^2$ |
| carbon black | 0.66 $g/m^2$ |
| polyvinylalcohol | 0.6 $g/m^2$ |
| total dry coverage | 2.9 $g/m^2$ |

exposure and processing

Laser recording occurred under the following conditions:

NdYLF laser emitting at 1053 nm; external drum; exposure through the coated side; spot diameter ($1/e^2$) 14.9 μm; recording speed 4.4 m/s; power on film 150 mW; 3400 dpi; or, diode laser emitting at 832 nm; external drum; exposure through the backside; spot diameter ($1/e^2$) 9.6 μm: recording speed 1.1 m/s; 94–120 mW; 3400 dpi.

After exposure the non-exposed areas of the image forming layer were removed by gentle rubbing under tap water.

image evaluation

Transmission densities were measured with a Macbeth TD904 spectrophotometer with a UV-filter. The density results are summarized in following table 1.

TABLE 1

| | before recording | after recording and wash-off | | |
|---|---|---|---|---|
| Sample | Dmax | diodelaser Dmax | NdYLF Dmax | Dmin |
| comp. 1 | 2.15 | 2.05 | 2.09 | 0.06 |
| comp. 2 | 3.30 | 2.15 | 2.36 | 0.15 |
| inv. | 3.10 | 2.70 | 3.04 | 0.06 |

Comparing the invention sample with comparative sample 1, both having the same carbon coverage, it is clear that a higher Dmax, sufficient for image setting purposes, could be obtained with the invention sample both before and after exposure and processing. Both showed about the same physical vulnerability measured by a qualitative test. However, the physical vulnerability of comparative sample 2, having about the same Dmax before recording but a higher carbon coverage, showed to be much worse than the physical vulnerability of the invention sample. It can further be remarked that the Dmax obtained with comparative sample 2 after exposure and processing is insufficiently high in order to serve as an exposure mask.

We claim:

1. A thermal imaging medium comprising (1) a transparent support, (2) an image recording layer containing a hydrophilic binder, a substance capable of converting laser radiation into heat, and a dispersion of a hydrophobic polymer capable of undergoing thermocoagulation by the action of heat and having a built-in UV-absorber.

2. The thermal imaging medium according to claim 1 wherein said hydrophobic polymer is poly (methylmethacrylate) having a built-in UV-absorber.

3. The thermal imaging medium according to claim 1 wherein said UV-absorber built-in in said hydrophobic polymer is following compound:

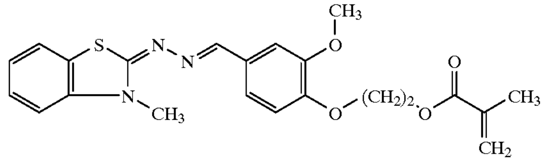

4. The thermal imaging medium according to claim 1 wherein said substance capable of converting laser radiation into heat is an infra-red absorbing compound and said laser radiation is produced by means of an infra-red emitting laser.

5. The thermal imaging medium according to claim 4 wherein said infra-red absorbing compound is an infra-red absorbing pigment.

6. The thermal imaging medium according to claim 5 wherein said infra-red absorbing pigment is carbon black.

7. The thermal imaging medium according to claim 6 wherein said carbon black is present in said image forming layer in an amount giving rise to an optical density of at most 2.5.

8. The thermal imaging medium according to claim 1 wherein said hydrophilic binder of said image forming layer is polyvinylalcohol.

9. A method for formation of a heat mode image comprising the following steps:

(A) exposing information-wise to laser radiation a thermal imaging medium according to claim 1 to provide unexposed and exposed parts, and (B) removing the unexposed parts by a wash-off step thus leaving an image in the exposed parts.

* * * * *

UNITED STATES PATENT AND TRADEMARK OFFICE

CERTIFICATE OF CORRECTION

PATENT NO. : 5,952,136

DATED : September 14, 1999

INVENTOR(S) : Eddie Daems et al

It is certified that error appears in the above-indentified patent and that said Letters Patent is hereby corrected as shown below:

Title page, Item
[75] Inventors: "Rita Torfs, Herenhout" should read -- Rita Torfs, Herenthout --;

Title page, Item
[30] Foreign Application Priority Data "Dec. 6, 1996" should read -- Dec. 4, 1996 --.

Signed and Sealed this

Twelfth Day of December, 2000

*Attest:*

Q. TODD DICKINSON

*Attesting Officer*

*Director of Patents and Trademarks*